United States Patent [19]
Eckels

[11] Patent Number: 5,936,499
[45] Date of Patent: Aug. 10, 1999

[54] PRESSURE CONTROL SYSTEM FOR ZERO BOILOFF SUPERCONDUCTING MAGNET

[75] Inventor: Phillip William Eckels, Florence, S.C.

[73] Assignee: General Electric Company, Milwaukee, Wis.

[21] Appl. No.: 09/025,366

[22] Filed: Feb. 18, 1998

[51] Int. Cl.[6] .................................................. H01F 1/00
[52] U.S. Cl. ........................ 335/216; 62/47.1; 505/892
[58] Field of Search .................................. 335/216, 300, 335/301; 324/388–21; 62/47.1, 48.1, 54; 505/892

[56] References Cited

U.S. PATENT DOCUMENTS

| | | | |
|---|---|---|---|
| 4,484,458 | 11/1984 | Longsworth | 62/54 |
| 4,543,794 | 10/1985 | Matsutani et al. | 62/54 |
| 4,796,433 | 1/1989 | Barlett | 62/54 |
| 5,150,578 | 9/1992 | Oota et al. | 62/47.1 |
| 5,398,515 | 3/1995 | Lak | 62/47.1 |
| 5,613,367 | 3/1997 | Chen | 62/47.1 |
| 5,735,129 | 4/1998 | Ienaga | 62/51.1 |

FOREIGN PATENT DOCUMENTS 2292449  2/1996  United Kingdom .

*Primary Examiner*—Lincoln Donovan
*Attorney, Agent, or Firm*—Irving M. Freedman; Christian G. Cabou; Phyllis Y. Price

[57] ABSTRACT

A pressure control system for the cryogen pressure vessel of a helium cooled superconducting magnet assembly including a helium gas recondenser to return liquid helium to the helium supply including a temperature sensor proximate to the recondenser to provide a control signal for maintaining a preselected temperature of said recondenser in order to maintain a preselected pressure within said helium vessel above the pressure outside the vessel and further including an indication of the thermal conductance across the interface between the recondenser and the cryocooler which cools the recondenser.

20 Claims, 2 Drawing Sheets

FIG_1

PRESSURE CONTROL SYSTEM FOR ZERO BOILOFF SUPERCONDUCTING MAGNET

BACKGROUND OF INVENTION

This invention relates to pressure control for helium cooled superconducting magnet assemblies suitable for magnetic resonance imaging (hereinafter called "MRI"), and more particularly to an improved and simplified helium bath pressure control for systems utilizing a recondenser for recondensing the resultant helium gas back into liquid helium.

As is well known, a superconducting magnet can be made superconducting by placing it in an extremely cold environment, such as by enclosing it in a cryostat or pressure vessel containing a cryogen such as liquid helium. The extreme cold maintains current flow through the magnet coils after a power source initially connected to the coil (for a relatively short period) is disconnected due to the absence of electrical resistance in the cold magnet coils, thereby maintaining a strong magnetic field. Superconducting magnet assemblies find wide application in the field of MRI.

The provision of a steady supply of liquid helium to NMRI installations all over the world has proved to be difficult and costly leading to considerable research and development efforts directed at minimizing the need to replenish the boiling liquid helium such as by recondensing the resultant helium gas. Also, it is desirable to avoid the difficulties encountered in storing the necessary reserve supply of liquid helium at cryogenic temperatures of around 4° K (or close to absolute zero) and the related problems of periodically transferring a portion of the liquid helium in the storage reservoir to the liquid helium supply in the MRI superconducting magnet.

In a typical MRI magnet, the main superconducting magnet coils are enclosed in a cylindrically shaped pressure vessel defining an imaging bore in the central region along its axis. The magnetic field in the imaging bore must be very homogenous and temporally constant for accurate imaging.

Superconducting magnets which recondense the helium gas back to liquid helium are often referred to as zero boiloff (ZBO) magnets. In such ZBO magnets the pressure within the helium vessel must be maintained at pressures above the exterior atmospheric pressure to prevent cryopumping. Cryopumping occurs when helium vessel internal pressure is less than the surrounding atmospheric pressure such that contaminants can be drawn into the helium vessel causing blockages in the magnet penetration which adversely affect MRI performance. Helium vessel pressure below atmospheric pressure can result if the cooling capacity of the cryogenic recondenser exceeds the heat load from the surroundings, namely the cryostat. A typical electrical pressure control system to avoid cryopumping requires a pressure sensor, a controller, wiring, a transducer and a control response which may be either an internal heater which is adjusted by the controller, or a cryocooler speed control system responsive to variations in pressure within the helium vessel.

It has been discovered that operational variations in helium gas pressure within the helium pressure vessel can flex the helium vessel and superconducting magnet coil wires, altering the spatial distribution of current flow through the coils and homogeneity of the magnetic field sufficient to degrade the quality of images produced by the MRI imaging system. The problem is most pronounced in lighter weight pressure vessels being used in lightweight MRI equipment.

Pressure sensor based pressure control systems, whether utilizing a single pressure sensor, or a pair of separated pressure sensors to sense pressure differentials, require an internal pressure sensor exposed to the helium gas within the helium pressure vessel requiring access to the interior of the helium vessel from the exterior pressure control system through a port or tube. This provides a passage through which unwanted heat is introduced into the helium pressure vessel through which resultant Taconis oscillations or pumping action can pump heat into the interior of the helium vessel increasing helium boiling. It is also possible for frost to form in the pressure sensor tubing affecting its operation. Moreover, pressure sensors are more expensive than other types of sensors.

As a result, pressure sensors which respond to variations in pressure within the helium vessel have not proven to be entirely satisfactory in MRI helium pressure control systems.

SUMMARY OF INVENTION

Thus, there is a particular need for an improved pressure control system for the helium pressure vessel which avoids the aforementioned problems yet which accurately responds to, and corrects for, variations of pressure to maintain a preselected pressure within the helium vessel.

In accordance with one form of the invention, a zero boiloff helium-cooled superconducting magnet utilizing a helium gas recondenser includes a pressure control system to maintain a preselected pressure within the helium pressure vessel and which is responsive to variations in pressure within the helium vessel as detected by a temperature sensor sensing corresponding variations in temperature at the recondenser positioned outside the pressure vessel to provide an accurate control signal for controlling the pressure within the helium vessel through a recondenser temperature controller.

DESCRIPTION OF DRAWINGS AND INVENTION

Figure 1:
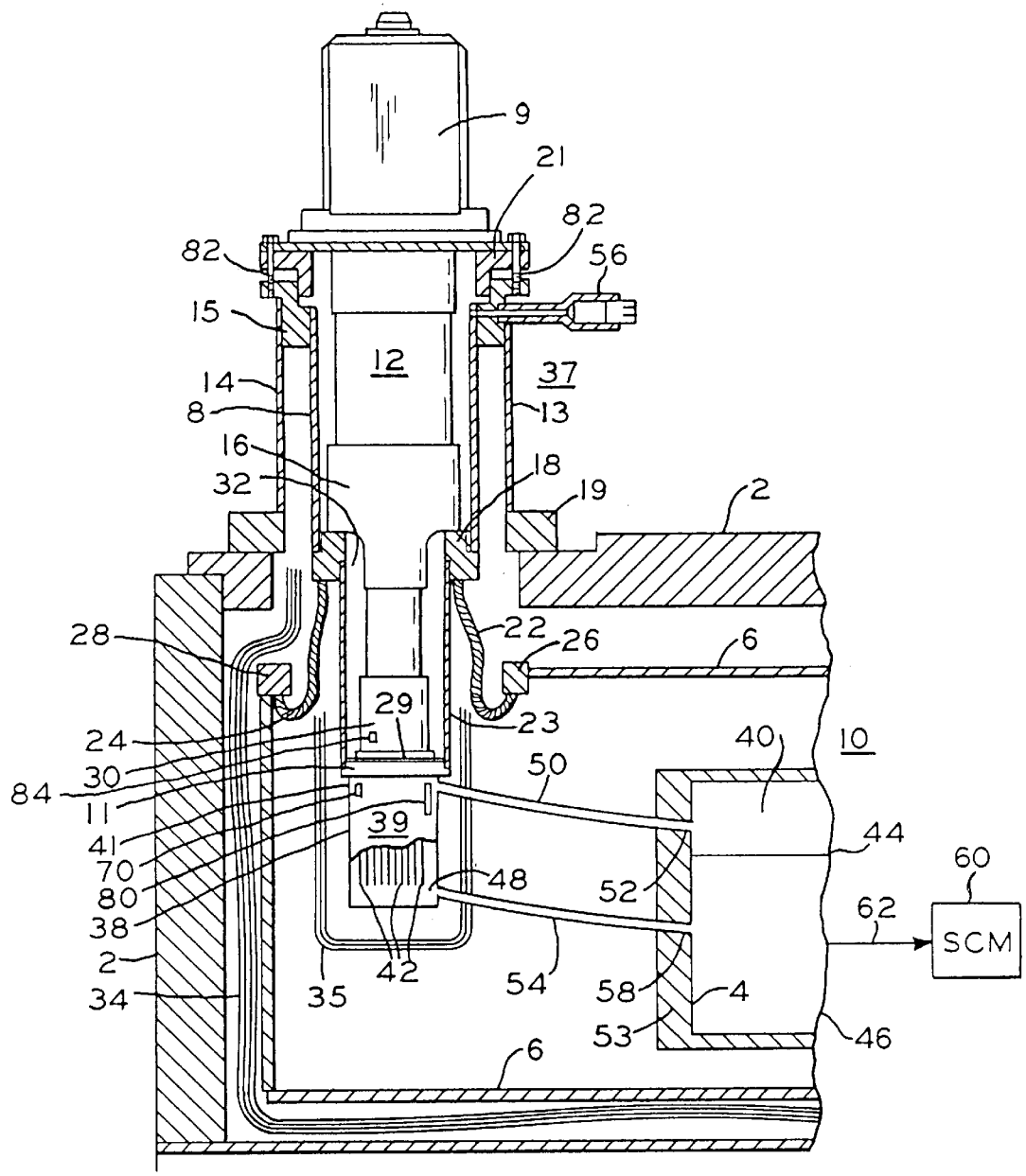
FIG. 1 is a cross-section of a portion of a MRI superconducting magnet shown in simplified form incorporating the sensor portion of the present invention.

Referring first to FIG. 1, MRI magnet system 10 includes helium pressure vessel 4 including a liquid cryogen such as helium surrounded by vacuum vessel 2 with thermally isolating radiation shield 6 interposed between the helium vessel and the vacuum vessel. A cryocooler 12 (which may be a Gifford-Mahon cryocooler) extends through vacuum vessel 2 within sleeve 8 such that the cold end of the cryocooler may be selectively positioned within the sleeve without destroying the vacuum within vacuum vessel 2, and heat generated by motor 9 of the cryocooler is outside the vacuum vessel. External cryocooler sleeve ring 14 extends outside vacuum vessel 2, and collar 19 and sleeve flange 15 enable the securing of outer cryocooler sleeve 13 to vacuum vessel 2. Cryocooler 12 is installed in the cryocooler sleeve assembly 8, 18, 23 with matching transition flange 21 and secured with bolts 82 and associated washers.

First stage heat station 16 of cryocooler 12 contacts copper first stage thermal sleeve or heat sink 18 which is thermally connected through braided copper flexible thermal couplings 22 and 24 and copper thermal blocks 26 and 28 on isolating radiation shield 6 to cool the radiation shield to a temperature of approximately 60° K providing thermal isolation between helium vessel 4 and vacuum vessel 2. Flexible couplings 22 and 24 also provide mechanical or vibration isolation between cryocooler 12 and radiation shield 6.

The bottom surface of second stage heat station 30 of cryocooler 12 contacts indium gasket 29 to efficiently provide a temperature of 4° K to heat sink 11 positioned on the opposite side of the indium gasket. Indium gasket 29 provides good thermal contact between the cryocooler heat station 30 and heat sink 11.

Extending below, and thermally connected to, heat sink 11 is helium recondensing chamber 38, made of high thermal conductivity material such as copper, which includes a plurality of substantially parallel heat transfer plates or surfaces 42 in thermal contact with heat sink 11 and forming passages between the surfaces of the plates for the passage of helium gas from helium pressure vessel 4.

Helium gas 40 forms above liquid helium surface level 44 of liquid helium supply 46 through the boiling of the liquid helium in providing cryogenic temperatures to MRI magnet system 10. Helium gas 40 passes through gas passageway 52, through the wall 53 of helium vessel 4, and through helium gas passage 50 to the interior of the upper portion 41 of helium recondensing chamber or canister 38. Heat transfer plates 42 within recondenser 39 are cooled to 4° K by second stage 30 of cryocooler 12, such that helium gas 40 passing between the plates recondenses into liquid helium to collect in bottom region 48 of helium recondensing chamber 38. The recondensed liquid helium then flows by gravity through helium return line 54 and liquid helium passage 58 in helium vessel 4 back to liquid helium supply 46, it being noted that helium recondensing chamber 38 is positioned higher than liquid helium passageway 58 in helium vessel 4.

As a result, during operation of MRI magnet system 10 liquid helium 46 cools superconducting magnet coil assembly (shown generally as 60) to a superconducting temperature with the cooling indicated generally by arrow 62 in the manner well known in the MRI art, resulting in boiling of helium liquid 46 and production of helium gas 40 above helium surface level 44. However, helium gas 40 instead of being vented to the surrounding atmosphere 37 as is common in many MRI equipments, flows through gas passageway 52 in wall 53 of helium pressure vessel 4, and through helium gas passage 50 to the interior of helium recondensing chamber 38 to pass between cryocooler cooled heat transfer plates 42 to recondense back to liquid helium. The recondensed liquid helium drops to bottom region 48 of the helium recondensing chamber 38 where it collects and flows by gravity through helium return line 54 and liquid helium passageway 58 through helium vessel 4 back to liquid helium supply 46, thus returning the recondensed helium gas back to the liquid helium supply as liquid helium.

In addition to cooling radiation shield 6 by first stage 16 of cryocooler 12, superinsulation 34 is provided in the space between radiation shield 6 and vacuum vessel 2 to further thermally isolate helium vessel 4 from vacuum vessel 2. Superinsulation 35 is also provided between recondensing chamber 38 and helium vessel 4 to thermally isolate the recondensing chamber 38 during servicing of cryocooler 12 which warms up cryocooler sleeve 13. Superinsulation 34 and 35 is aluminized Mylar multi-layer insulation used in the superconducting magnet industry.

Figure 2:
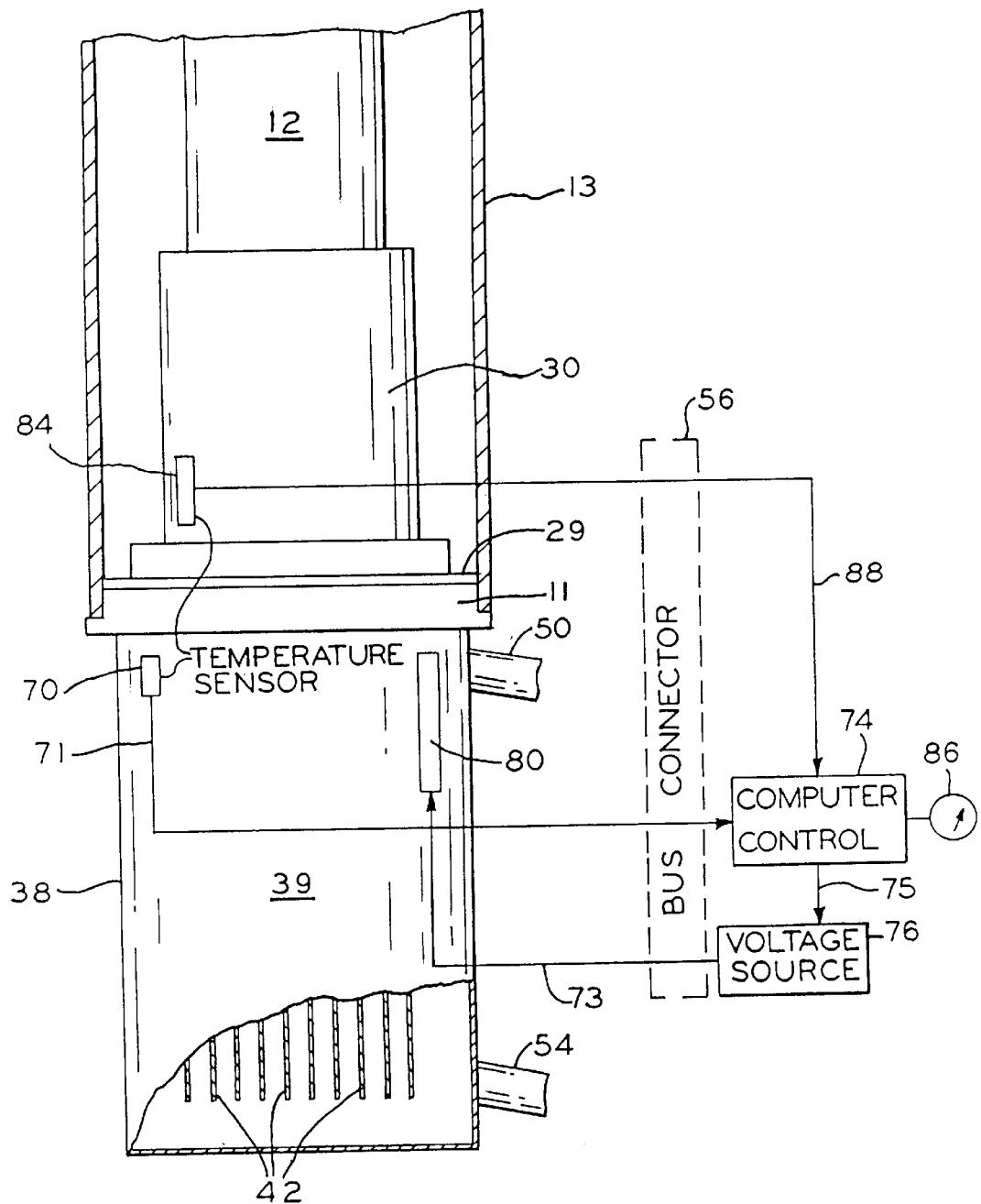
FIG. 2 is an enlarged portion of FIG. 1 showing details of the pressure control system responsive to the sensors shown in FIG. 1.

As best shown in FIG. 2, temperature sensor 70, which may be Ruthenium oxide cryogenic temperature sensor, such as sold by Scientific Instruments, Inc. as their Model R0600, is positioned on the surface of recondenser canister 39 proximate to second stage heat sink 11 to sense the temperature of recondenser 39. Output signal 71 of temperature sensor 70 is connected through connector 56 to computer control or controller 74, a Scientific Instruments model 9650 controller, to provide a control signal 75 to variable voltage source 76 within controller 74 to control current flow through electric strip heater 80 positioned on canister 38 of recondenser 39. Temperature sensor 70 and heater 80 are positioned in approximately diametrically opposed positions on recondensing chamber 38 to provide desirable interaction time constants. That is, the spatial separation of temperature sensor 70 and heater 80 ensures that the temperature control action is stably responsive in that the temperature sensor senses the temperature of recondenser 39 and not that of the heater which when actuated would be at a temperature higher than that of the recondenser. While recondenser temperature sensor 70 is shown on recondenser canister 30 proximate or adjacent to heat station or heat sink 30, it may be placed directly on the heat station.

Measurements of recondenser 39 temperature and helium vessel 4 pressure were found to be exactly correlated by the temperature-pressure saturation curve of the liquid helium cryogen 46. Other possible temperature measurement locations in the helium pressure vessel 4 do not follow this saturation curve because of thermal stratification, varying helium levels, and heat flow within the helium pressure vessel. Thus, recondenser 39 temperature outside helium vessel 4 proved to be an unexpected remote temperature location responsive to the helium vessel internal pressure providing a control signal for accurate regulation of that pressure.

Also, temperature sensor 70 is less expensive and more readily accessible than pressure sensors connected to the interior of helium vessel 4. Moreover, the recondenser temperature sensing control is independent of differences in helium level 44 which occurs during operation of superconducting magnet 10.

A second temperature sensor 84 may be added to take advantage of the existence and position of temperature sensor 70 to assist in the proper adjustment of cryocooler 12 relative to recondenser 39. It is important for proper cooling of recondenser 39 to have the optimum or proper pressure across indium gasket 29 to provide effective thermal contact and thermal connection to minimize thermal losses. The pressure or force exerted by the sandwich of the bottom of cryocooler 12 and recondenser 39 on gasket 29 is adjusted by the selective tightening of bolts 82. The temperature drop, if any, across indium gasket 29 can be indicated by meter 86 at controller 74. Temperature sensor 84 is positioned on the cryocooler side of indium gasket 29 to provide a second temperature responsive signal 88. Accordingly, bolts 82 may be selectively tightened to press cryocooler 12 against indium gasket 29 a sufficient amount to insure good thermal contact as detected by the temperature differential, if any, sensed by temperature sensors 70 and 84 and as indicated by meter 86 without overtightening and possible damaging the indium gasket.

While the present invention has been described with respect to certain preferred embodiments thereof, it is to be understood that numerous variations in the details of construction, the arrangement and combination of parts, and the types of materials used may be made without departing from the spirit and scope of the invention.

What is claimed is:

1. A zero boiloff cryogen cooled recondensing superconducting magnet assembly including superconducting magnet coils suitable for magnetic resonance imaging comprising:

a cryogen pressure vessel to contain a liquid cryogen reservoir to provide cryogenic temperatures to said magnet coils for superconducting operation;

a vacuum vessel surrounding said pressure vessel and spaced from said pressure vessel;

a cryocooler;

a recondenser positioned in the space between said pressure vessel and said vacuum vessel and thermally connected by a thermal interface to said cryocooler to recondense, back to liquid, cryogen gas provided from said pressure vessel;

means to return the recondensed liquid cryogen to said pressure vessel; and pressure control means to control the cryogen gas pressure within said pressure vessel above the pressure outside said pressure vessel;

a temperature sensor positioned outside said cryogen pressure vessel proximate to, and sensing the temperature variations at, said thermal interface;

said pressure control means being responsive to said temperature sensor to control the cryogen gas pressure within said cryogen pressure vessel in order to avoid cryopumping.

2. The zero boiloff superconducting magnet of claim 1 wherein said pressure control means controls the temperature of said recondenser to in turn control the pressure within said pressure vessel.

3. The zero boiloff superconducting magnet of claim 2 including a thermal interface between said cryocooler and said recondenser, and wherein said temperature sensor is positioned in the region proximate to said thermal interface.

4. The zero boiloff superconducting magnet of claim 3 including an electrical heater in thermal contact with said recondenser and stably responsive to variations in the temperature of said recondenser as sensed by said temperature sensor.

5. The zero boiloff superconducting magnet of claim 4 wherein said temperature sensor and said electrical heater are spaced from each other sufficiently to avoid a control action responsive to the temperature of said heater.

6. The zero boiloff superconducting magnet of claim 5 wherein said spacing is approximately 180° around the surface of said thermal interface.

7. The zero boiloff superconducting magnet of claim 3 wherein said thermal interface includes a heat sink and said temperature sensor is positioned on said heat sink.

8. The zero boiloff superconducting magnet of claim 3 wherein said thermal interface includes a heat sink and said temperature sensor is positioned on said recondenser proximate to said heat sink.

9. The zero boiloff superconducting magnet of claim 5 wherein said temperature sensor is a ruthenium oxide cryogenic sensor.

10. The zero boiloff superconducting magnet of claim 5 wherein a thermal gasket is provided between said cryocooler and said recondenser to provide a thermal interface, and means to selectively adjust the mechanical pressure across said thermal interface, said means to adjust including means to indicate the temperature drop across said thermal interface.

11. The zero boiloff superconducting magnet of claim 7 wherein a second temperature sensor is positioned on said cryocooler adjacent said thermal interface and said means to indicate utilizes the temperature difference across said thermal interface as sensed by said temperature sensor and said second temperature sensor.

12. The zero boiloff superconducting magnet of claim 8 wherein said thermal interface is an indium gasket.

13. A zero boiloff liquid helium cooled recondensing superconducting magnet assembly suitable for magnetic resonance imaging comprising:

a helium pressure vessel to contain a liquid helium reservoir to provide cryogenic temperatures to said magnetic resonance imaging magnet assembly for superconducting operation;

a recondenser and a cryocooler for cooling said recondenser to recondense helium gas formed in said pressure vessel back to liquid helium;

pressure control means to maintain the helium gas pressure within said helium pressure vessel above surrounding atmospheric pressure to avoid cryopumping; and a temperature sensor positioned proximate to said recondenser outside said helium vessel to provide a control signal responsive to the temperature of said recondenser;

and pressure control means controlling the temperature of said recondenser at a preselected level to maintain said helium gas pressure within said pressure vessel in response to said control signal;

whereby a sensor positioned within said helium vessel and associated mechanical leads through said helium vessel are avoided.

14. The zero boiloff superconducting magnet of claim 12 including a thermal interface between said cryocooler and said recondenser, and wherein said cryocooler includes a cold end and said temperature sensor is positioned in the region adjacent said cold end.

15. The zero boiloff superconducting magnet of claim 13 including a heater in thermal contact with said recondenser and spaced from said temperature sensor, said heater being responsive to variations in the temperature sensed by said temperature sensor.

16. The zero boiloff superconducting magnet of claim 14 wherein said thermal interface includes a thermal gasket between said cryocooler and said temperature sensor is positioned proximate to thermal interface.

17. The zero boiloff superconducting magnet of claim 15 wherein said temperature sensor and said heater are sufficiently spaced to avoid a control response of said pressure control means to the temperature of said heater.

18. The zero boiloff superconducting magnet of claim 14 including means to selectively press said cryocooler toward said recondenser to compress said thermal interface and vary the thermal coupling between said cryocooler and said recondenser.

19. The zero boiloff superconducting magnet of claim 18 further including an indication of the thermal coupling effectiveness of said thermal interface under pressure utilizing said temperature sensor.

20. The zero boiloff superconducting magnet of claim 16 wherein said indication is provided by an indication of the differential temperature across said thermal interface as detected by said temperature sensor in combination with a second temperature sensor positioned proximate to said cold end of said cryocooler.

* * * * *